(12) United States Patent
Wilson et al.

(10) Patent No.: US 7,511,939 B2
(45) Date of Patent: *Mar. 31, 2009

(54) LAYERED CAPACITOR ARCHITECTURE AND FABRICATION METHOD

(75) Inventors: Craig Wilson, Livermore, CA (US);
Michael Dunbar, San Jose, CA (US);
Derek Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 89 days.

This patent is subject to a terminal disclaimer.

(21) Appl. No.: 11/895,339

(22) Filed: Aug. 24, 2007

(65) Prior Publication Data

US 2008/0062613 A1    Mar. 13, 2008

Related U.S. Application Data

(60) Provisional application No. 60/823,410, filed on Aug. 24, 2006.

(51) Int. Cl.
*H01G 4/228* (2006.01)

(52) U.S. Cl. ............... 361/306.2; 361/306.1; 361/306.3; 361/301.4; 361/311; 361/313; 438/253; 438/620; 438/622; 257/295; 257/296

(58) Field of Classification Search .......... 361/306.2, 361/306.1, 306.3, 301.3, 301.4, 311–313; 438/253, 620, 622; 257/302–303, 295–296
See application file for complete search history.

(56) References Cited

U.S. PATENT DOCUMENTS

| | | | |
|---|---|---|---|
| 5,847,423 A * | 12/1998 | Yamamichi | 257/296 |
| 6,178,083 B1 | 1/2001 | Appeltans et al. | 361/306.1 |
| 6,239,460 B1 * | 5/2001 | Kuroiwa et al. | 257/300 |
| 6,548,338 B2 * | 4/2003 | Bernstein et al. | 438/210 |
| 6,606,237 B1 * | 8/2003 | Naito et al. | 361/306.3 |
| 6,614,642 B1 * | 9/2003 | Moon et al. | 361/306.1 |
| 6,784,478 B2 * | 8/2004 | Merchant et al. | 257/303 |
| 6,794,904 B2 * | 9/2004 | Ooishi et al. | 326/103 |
| 6,906,370 B1 * | 6/2005 | Hubner et al. | 257/296 |
| 7,154,162 B2 * | 12/2006 | Ahn et al. | 257/532 |
| 7,230,434 B1 | 6/2007 | Sasaki | 324/548 |

FOREIGN PATENT DOCUMENTS

CA    2214123    2/2005

\* cited by examiner

*Primary Examiner*—Nguyen T Ha
(74) *Attorney, Agent, or Firm*—Koppel, Patrick, Heybl & Dawson

(57) ABSTRACT

A layered capacitor structure comprises two or more semiconductor/dielectric plates formed above an insulating surface which provides mechanical support, with the plates arranged in a vertical stack on the insulating surface. An insulating layer is on each plate, patterned and etched to provide an opening which allows the top of one plate to be in physical and electrical contact with the bottom of the subsequent plate. Contact openings are provided through the insulating layers, each of which provides access to a respective semiconductor layer and is insulated from any other semiconductor/dielectric plate. Electrical contacts through the contact openings provide electrical connections to respective semiconductor layers. The present structure can include as many stacked layers as needed to provide a desired total capacitance or range of capacitances.

15 Claims, 5 Drawing Sheets

LAYERED CAPACITOR ARCHITECTURE AND FABRICATION METHOD

RELATED APPLICATIONS

This application claims the benefit of provisional patent application No. 60/823,410 to Wilson et al., filed Aug. 24, 2006.

BACKGROUND OF THE INVENTION

1. Field of the Invention

This invention relates generally to integrated circuit (IC) capacitors, and more particularly to a layered capacitor architecture and fabrication method.

2. Description of the Related Art

Integrated circuits frequently require the use of one or more capacitive devices, which serve numerous purposes in both analog and digital circuits. For example, a capacitor can provide an integration function, serve as part of a filter design, act as an energy or data storage device, or provide a bypass or decoupling capacitance on an IC.

However, a capacitor integrated on an IC die is necessarily small, and thus inherently limited with respect to the amount of capacitance it can provide. At the same time, modern electronic circuits require devices with ever greater capacitances. However, as integration density increases, chip space for large capacitors is less readily available. Numerous capacitor designs are known for providing increased capacitance by increasing the area of their conductive plates, and/or reducing the thickness of their dielectric layer. However, these devices remain limited in their ability to provide high capacitance values, due to the limited chip area typically allotted for capacitors.

Off-chip devices can provide large capacitances, but often cannot be used due to their size, as well as the length and number of connections required and the attendant signal propagation times, resistive voltage drops and connection inductances.

SUMMARY OF THE INVENTION

A layered capacitor architecture and fabrication method are presented which enables a designer to provide a relatively high capacitance in a limited amount of chip area.

The structure of the present integrated circuit capacitor structure is fabricated on an insulating surface which provides mechanical support. Two or more semiconductor/dielectric plates are arranged in a vertical stack on top of the insulating surface, each of which comprises a first semiconductor layer and a dielectric layer on the semiconductor layer, the semiconductor and dielectric layers patterned and etched such that they have a desired pattern, and such that each pair of semiconductor layers separated by a dielectric layer form a capacitor. The structure also includes a topmost layer which forms a capacitor with the topmost semiconductor/dielectric plate.

An insulating layer is deposited on each semiconductor/dielectric plate, and is patterned and etched to provide an opening such that the semiconductor layer of the plate immediately above the insulating layer is in physical and electrical contact with the dielectric layer of the plate immediately below the insulating layer.

After all plates have been formed, contact openings are made through the insulating layers, each of which provides access to a respective semiconductor layer. The structure is arranged such that each contact opening provides access to one semiconductor layer, and is insulated from all other semiconductor/dielectric plates. Electrical contacts are provided through the contact openings and to the topmost layer to provide electrical connections to respective semiconductor layers.

Stacking two capacitors in this way essentially reduces the required die area by 50% in comparison with a comparably-sized conventional capacitor. The present structure can include as many stacked layers as needed to provide a desired total capacitance or range of capacitances. In this way, total area consumed by a capacitor on a given integrated circuit is reduced in comparison with a comparably-sized conventional capacitor.

These and other features, aspects, and advantages of the present invention will become better understood with reference to the following drawings, description, and claims.

BRIEF DESCRIPTION OF THE DRAWINGS

FIGS. 3a-14a are sectional views illustrating a method of fabricating a layered capacitor per the present invention.

DETAILED DESCRIPTION OF THE INVENTION

Figure 1:
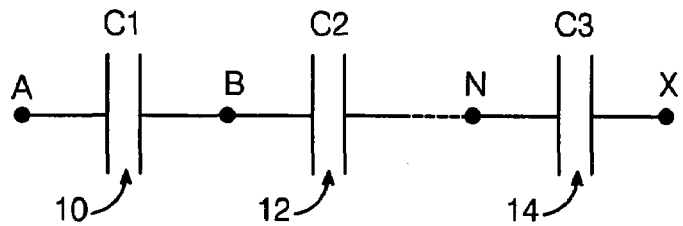
FIG. 1 is schematic diagram illustrating the layered capacitor architecture of the present invention.

FIG. 1 is an electrical description of the layered capacitor architecture of the present invention. The architecture is flexible in that it can include as many capacitor layers as are needed. As shown in FIG. 1, a first capacitor 10 having a capacitance C1 is provided between contact nodes A and B, a second capacitor 12 having a capacitance C2 is provided between contact nodes B and N, and a third capacitor 14 having a capacitance C3 is provided between contact nodes N and X. Each of nodes A, B, N and X is made accessible electrically, such that a variety of capacitance values can be obtained by connecting to the structure via the proper nodes.

Figure 2A:
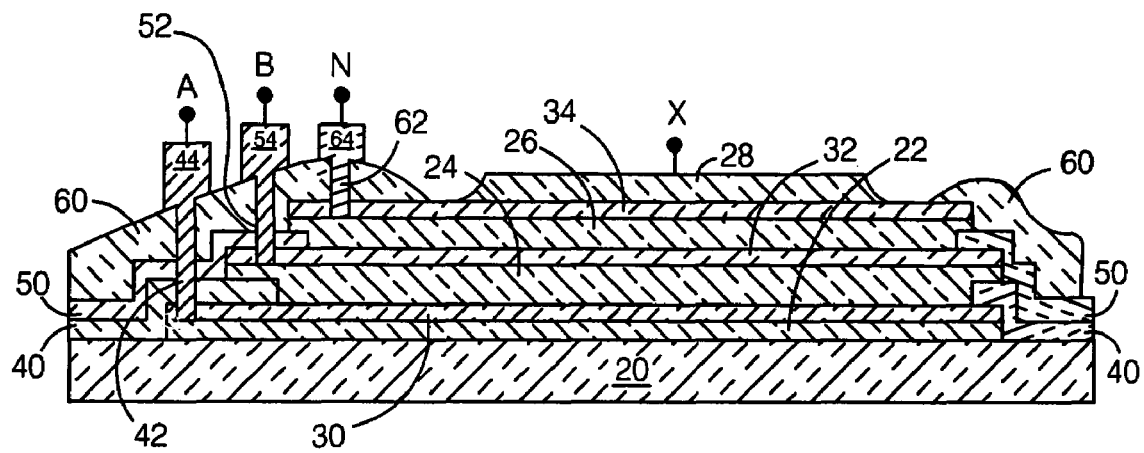
FIGS. 2a and 2b are sectional and corresponding plan views of a layered capacitor per the present invention.
Figure 2B:
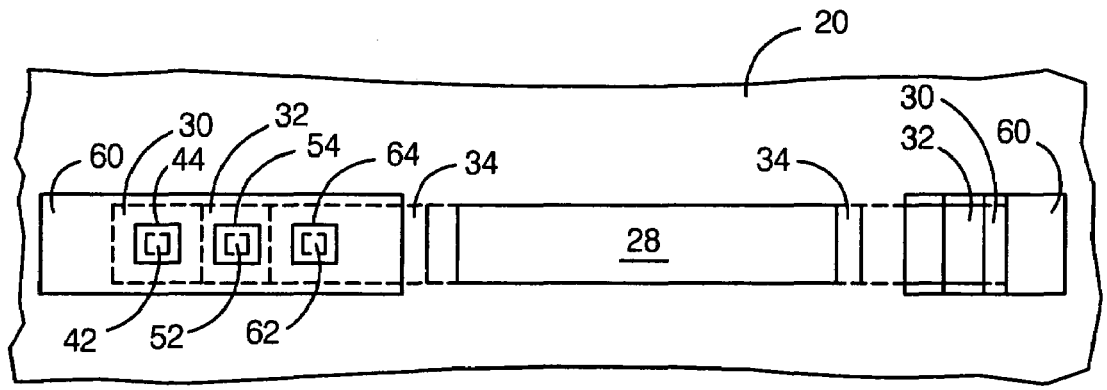

A sectional view of a capacitor structure per the present invention, which corresponds to the three capacitors of FIG. 1, is shown in FIG. 2a, with a corresponding plan view shown in FIG. 2b. The structure is fabricated on an insulating surface 20 which provides mechanical support. The structure includes semiconductor layers 22, 24, 26 and 28, with a dielectric 30 located between semiconductor layers 22 and 24, a dielectric layer 32 located between semiconductor layers 24 and 26, and a dielectric layer 34 located between semiconductor layers 26 and 28. Note that, as used herein, a "semiconductor layer" may alternatively be a conductor layer.

Insulating layers are employed to enable electrical connections to be made to each semiconductor layer independently. An insulating layer 40 is located above semiconductor layer 22 and dielectric layer 30 as shown, with a contact opening 42 and a metal contact 44 provided to enable electrical contact ('A') to semiconductor layer 22. An opening is also formed in insulating layer 40 so that semiconductor layer 24 is in physical and electrical contact with dielectric layer 30. Similarly, an insulating layer 50 is located above semiconductor layer 24 and dielectric layer 32 as shown, with a contact opening 52 and a metal contact 54 provided to enable electrical contact ('B') to semiconductor layer 24, and an opening which allows semiconductor layer 26 to be in physical and electrical contact with dielectric layer 32. Finally, an insulating layer 60 is located above semiconductor layer 26 and dielectric layer 34 as shown, with a contact opening 62 and a metal contact 64 provided to enable electrical contact ('N') to semiconductor layer 26, and an opening which allows semiconductor layer 28 to be in physical and electrical contact with dielectric layer 34. An electrical contact ('X') is also provided to the topmost semiconductor layer 28. Note that the capacitor structure is not limited to the rectangular shape shown in FIG. 2b; the structure could be, for example, square-shaped, or have other shapes as needed to meet the capacitance requirements of a particular application.

In this way, a variety of capacitance values are made available. With four electrical contacts as shown in FIGS. 1, 2a and 2b, six different capacitances may be achieved (A-B, A-N, A-X, B-N, B-X, N-X). Stacking additional semiconductor, dielectric and insulating layers in this fashion provides additional capacitance values from which to select.

The present capacitor structure can be utilized in several different ways. For example, a user could use terminals A and B to provide a first capacitance, and terminals N and X to provide a second capacitance. If desired, multiple capacitances can be connected in parallel externally to provide a higher total capacitance. Alternatively, the structure could be used to provide a single capacitance, with the user connecting to the two terminals which provide the needed capacitance value.

One possible method by which a capacitor in accordance with the present invention can be fabricated is illustrated in the sectional views of FIGS. 3a-14a.

Figure 3A:
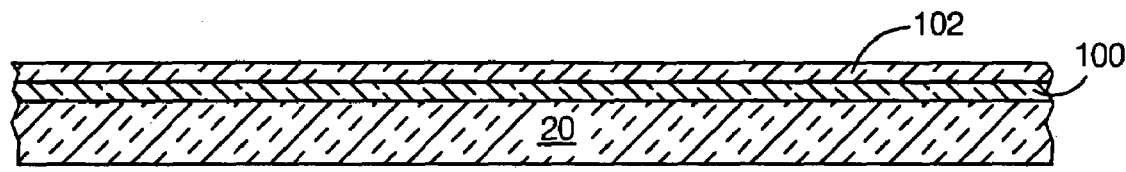

The first step is the formation of a first semiconductor/dielectric plate. As shown in FIG. 3a, a semiconductor material 100, such as polysilicon or polycide, is deposited onto an insulating surface 20 which serves as the mechanical support for the structure (such as silicon dioxide). This is followed by the deposition of a dielectric material 102, such as silicon nitride, silicon dioxide, tantalum oxide, etc. Film thicknesses for each of these layers preferably range from 1000 Å-4000 Å.

Figure 4A:
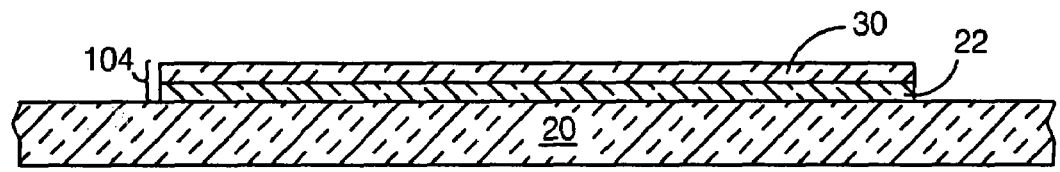

In FIG. 4a, semiconductor layer 100 and dielectric layer 102 are patterned and etched using standard semiconductor fabrication techniques such as plasma etching or wet etch to achieve a desired pattern, thereby forming the device layers identified as 22 and 30, respectively, in FIG. 2a. Layers 22 and 30 form a first semiconductor/dielectric plate 104.

Figure 5A:
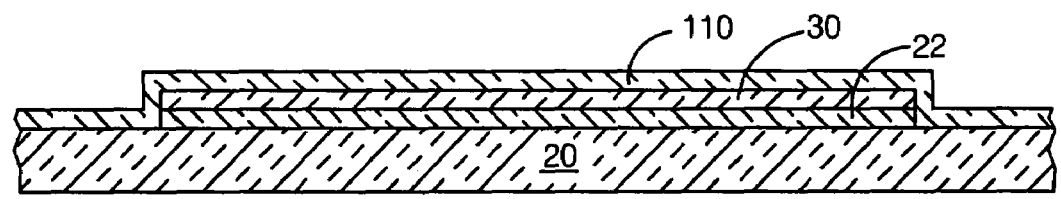
Figure 6A:
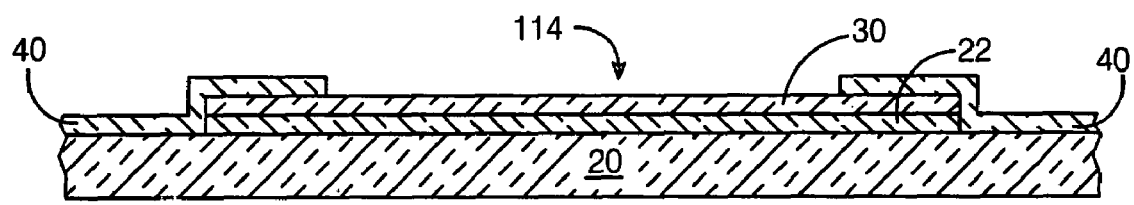

In FIG. 5a, a first insulating layer is fabricated. A layer of insulating material 110 (such as PECVD $SiO_2$, TEOS, PE-TEOS, etc.) is deposited on top of insulating surface 20 and semiconductor/dielectric plate 104. The film thickness for this insulating layer is preferably in the range of 1000 Å-4000 Å, depending on the voltage application. In FIG. 6a, insulating layer 110 is patterned and etched using standard semiconductor fabrication techniques such as plasma etching or wet etch to form the capacitor's first insulating layer 40, which protects first semiconductor/dielectric plate 104. An opening 114 is provided having desired dimensions; opening 114 allows dielectric layer 30 to be in physical and electrical contact with the layer deposited subsequently.

Figure 7A:
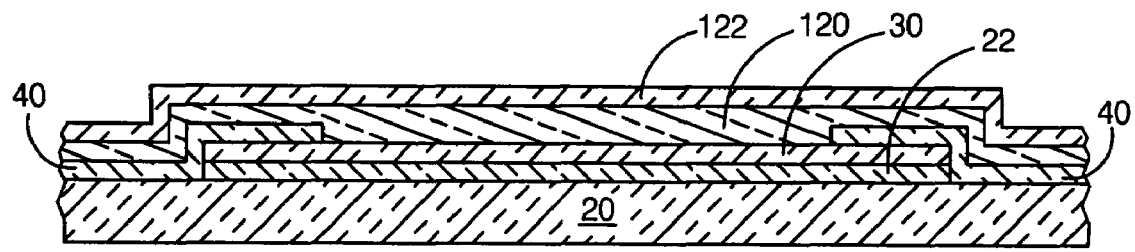
Figure 8A:
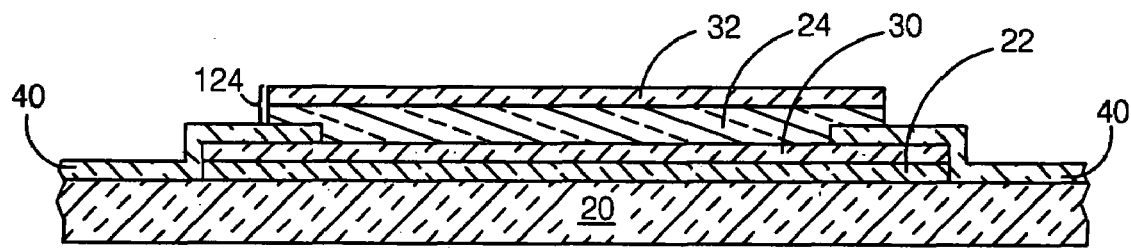

Next, another semiconductor/dielectric plate is formed. As shown in FIG. 7a, a semiconductor material 120 is deposited onto insulating surface 20, first semiconductor/dielectric plate 104, and first insulating layer 40, followed by the deposition of a dielectric layer 122. Layers 120 and 122 are then patterned and etched to form device layers 24 and 32, as shown in FIG. 8a. Layers 120 and 122 form a second semiconductor/dielectric plate 124.

Figure 9A:
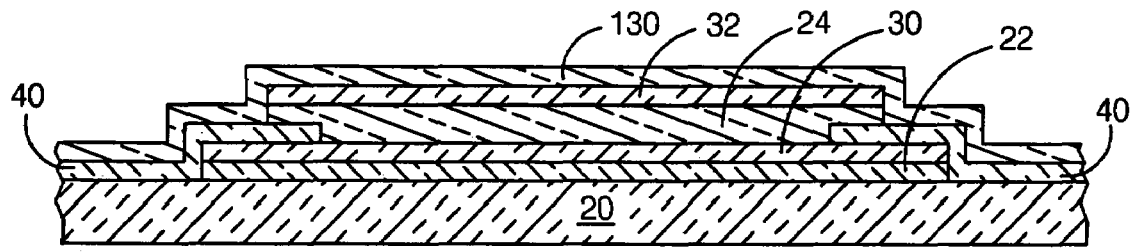
Figure 10A:
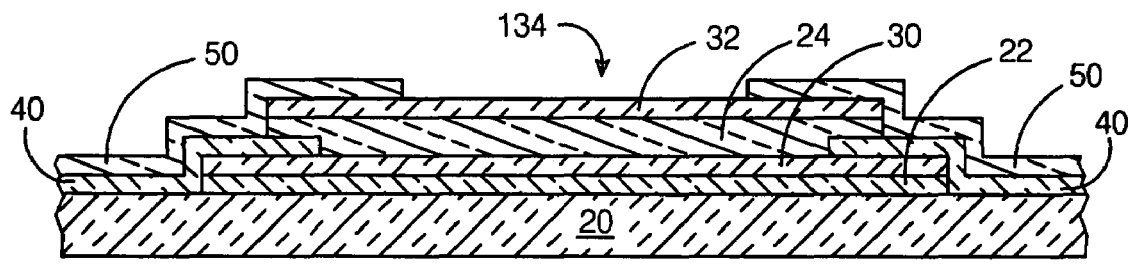

In FIG. 9a, a second layer of insulating material 130 is deposited on top of the existing structure, and in FIG. 10a, insulating layer 130 is patterned and etched to form the capacitor's second insulating layer 50, which protects second semiconductor/dielectric plate 124. Opening 134 is provided having desired dimensions, which allows dielectric layer 32 to be in physical and electrical contact with the layer deposited subsequently.

Figure 11A:
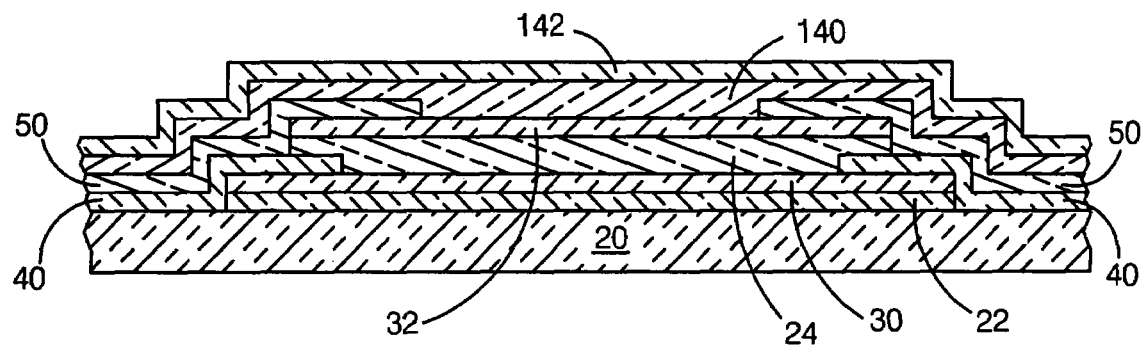
Figure 12A:
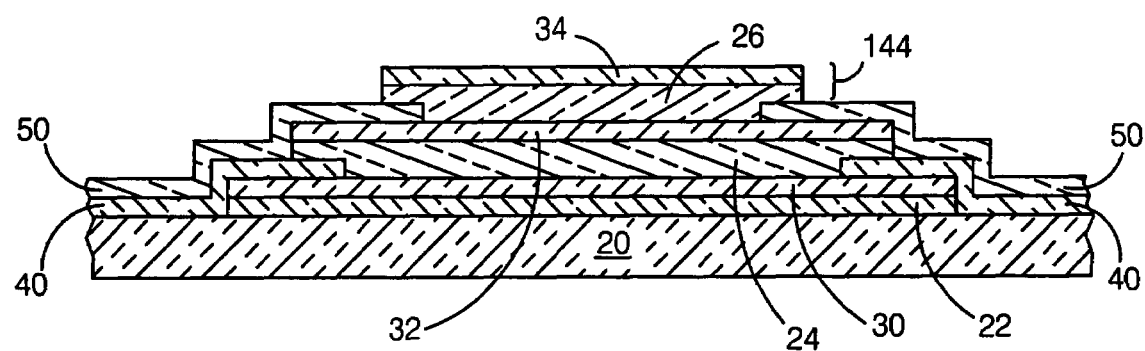

The present architecture allows as many semiconductor/dielectric plates as needed to be formed. In the exemplary embodiment shown, a third semiconductor/dielectric plate is formed. In FIG. 11a, a semiconductor material 140 is deposited over the existing structure, followed by the deposition of a dielectric layer 142. Layers 140 and 142 are patterned and etched to form device layers 26 and 34, as shown in FIG. 12a, thereby forming a third semiconductor/dielectric plate 144.

Figure 13A:
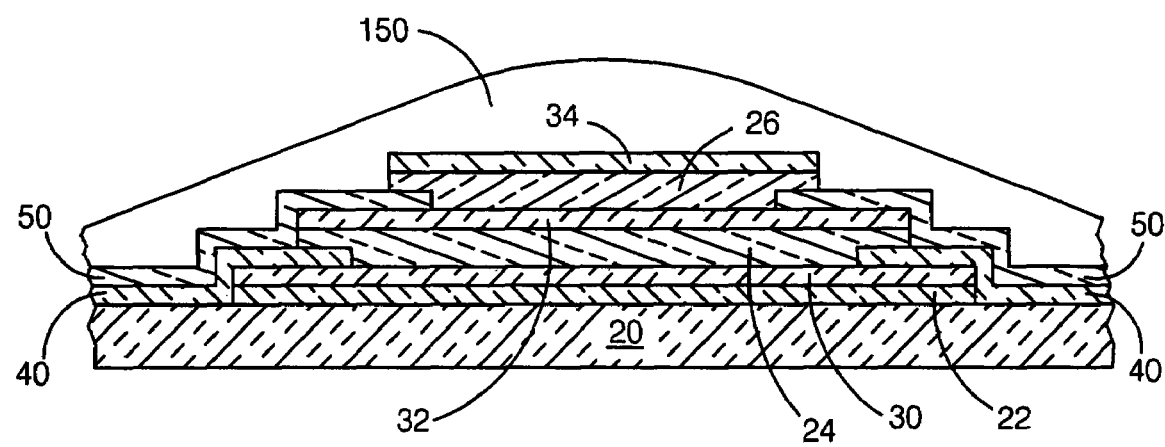
Figure 14A:
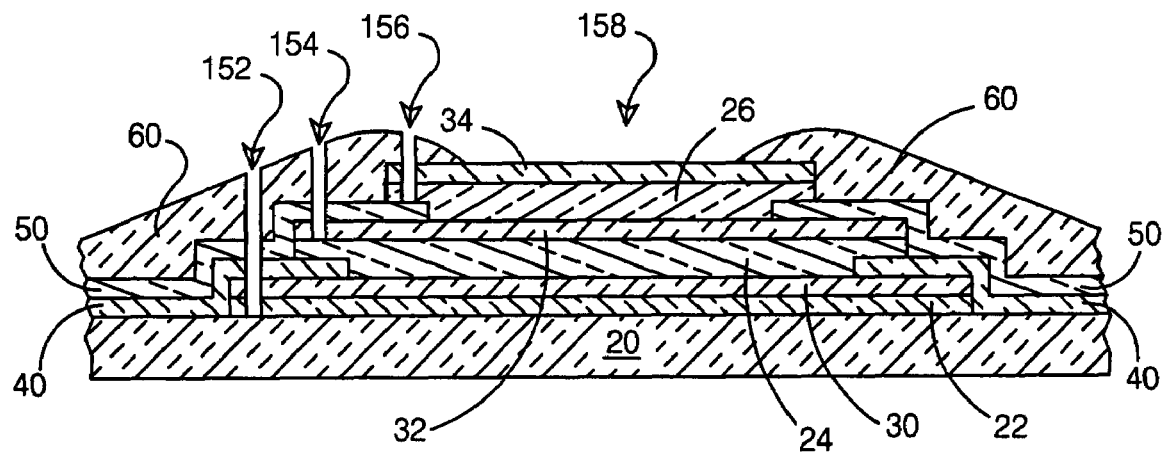

Fabrication continues in this fashion until the desired number of semiconductor/dielectric plates have been formed. When the topmost semiconductor/dielectric plate has been deposited, patterned and etched, a final insulating layer is provided to protect it. This is illustrated in FIG. 13a for the exemplary embodiment shown. Here, a third layer of insulating material 150 is deposited on top of the existing structure, and in FIG. 14a, insulating layer 150 is patterned and etched to form the capacitor's third insulating layer 50, which protects third semiconductor/dielectric plate 144. This step also forms contact openings 152, 154 and 156, which provide access to semiconductor layers 22, 24 and 26, respectively, and an opening 158. The structure is arranged such that each contact opening provides access to one semiconductor layer, and is insulated from all other semiconductor/dielectric plates.

This top insulating layer preferably also serves as the planarizing surface layer, to help improve the manufacturability and reliability of the multi-layer structure. The film composition preferably consists of reflow capable material, such as PECVD BPSG, BP-TEOS, etc. As before, an opening in this layer allows for the connection of dielectric layer 34 with a subsequently-deposited conductor or semiconductor layer.

Once the desired number of capacitor layers are fabricated, connection to the various semiconductor layers (here, layers 22, 24 and 26) in the structure is accomplished using standard semiconductor interconnect fabrication techniques, to provide contacts 42/44 ('A'), 52/54 ('B'), and 62/64 ('N'). For example, a contact etch technique using plasma etching, followed by W-fill processing could be used, or some other suitable conductor film deposition and patterning technology (e.g., plasma or wet etch of deposited aluminum or aluminum alloy films). Film thicknesses for the interconnect materials will depend directly on the current density requirements in the circuit application. Semiconductor layer/cap plate 28 is also formed in opening 158, to provide contact 'X'. This results in a structure as shown in FIG. 2a.

Thus, the present architecture and fabrication method enable the total area consumed by a capacitor on a given integrated circuit to be reduced, by using a novel capacitor fabrication method that involves stacking two or more capacitors. Stacking two capacitors essentially reduces the required die area by 50% in comparison with a comparably-sized conventional capacitor. Two or more capacitors can be stacked by the method described.

Note that a capacitor per the present invention is not limited to the materials and fabrication processes described above—numerous materials and fabrication techniques could be employed. It is only essential that semiconductor, dielectric and insulating layers be provided and physically arranged as described herein to provide a layered capacitor in accordance with the present invention.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A multi-layer integrated circuit capacitor structure, comprising:
   an insulating surface arranged to provide mechanical support for an integrated circuit structure; and
   two or more semiconductor/dielectric plates, said plates arranged in a vertical stack on top of said insulating surface, each of said semiconductor/dielectric plates comprising:
      a first semiconductor layer; and
      a dielectric layer on said semiconductor layer; said semiconductor and dielectric layers patterned and etched such that said layers have a desired pattern, each pair of semiconductor layers separated by a dielectric layer forming a capacitor;
   a topmost layer which forms a capacitor with the topmost semiconductor/dielectric plate;
   a plurality of insulating layers, one of said insulating layers deposited on each of said semiconductor/dielectric plates, each of said insulating layers patterned and etched to provide an opening such that the semiconductor layer of the plate immediately above said insulating layer is in physical and electrical contact with the dielectric layer of said plate immediately below said insulating layer, or such that said topmost layer is in physical and electrical contact with the dielectric layer of said plate immediately below said insulating layer when said plate is the topmost plate;
   contact openings provided through said insulating layers, each of which provides access to a respective one of said semiconductor layers and is insulated from the layers of any other semiconductor/dielectric plate; and
   electrical contacts through said contact openings and to said topmost layer which provide electrical connections to respective semiconductor layers.

2. The capacitor structure of claim 1, wherein the topmost insulating layer is planarized.

3. The capacitor structure of claim 1, wherein said semiconductor layers are polysilicon or polycide.

4. The capacitor structure of claim 1, wherein said dielectric layers are silicon nitride, silicon dioxide, or tantalum oxide.

5. The capacitor structure of claim 1, wherein each of said semiconductor and dielectric layers is 1000-4000 Å thick.

6. The capacitor structure of claim 1, wherein said insulating layers are silicon dioxide ($SiO_2$), tetraethyl orthosilicate (TEOS), or plasma-enhanced tetraethyl orthosilicate (PE-TEOS).

7. The capacitor structure of claim 1, wherein said insulating layers are 1000-4000 Å thick.

8. A integrated circuit capacitor structure, comprising:
   an insulating surface arranged to provide mechanical support for an integrated circuit structure;
   a first semiconductor layer on said insulating surface;
   a first dielectric layer on said first semiconductor layer, said first semiconductor and dielectric layers patterned and etched such that said layers have a desired pattern;
   a first insulating layer on said first dielectric layer, said first insulating layer patterned and etched to provide an opening through said first insulating layer above said patterned first dielectric layer which allows a subsequent layer to be deposited on said patterned first dielectric layer;
   a second semiconductor layer on said patterned first dielectric layer;
   a second dielectric layer on said second semiconductor layer, said second semiconductor and dielectric layers patterned and etched such that said layers have a desired pattern, said first and second patterned semiconductor layers and said first patterned dielectric layer forming a first capacitor;
   a second insulating layer on said second dielectric layer, said second insulating layer patterned and etched to provide an opening through said second insulating layer above said patterned second dielectric layer which allows a subsequent layer to be deposited on said patterned second dielectric layer;
   a third semiconductor layer on said patterned second dielectric layer;
   a third dielectric layer on said third semiconductor layer, said third semiconductor and dielectric layers patterned and etched such that said layers have a desired pattern, said second and third patterned semiconductor layers and said second patterned dielectric layer forming a second capacitor;
   a third insulating layer on said existing structure, said third insulating layer patterned and etched to provide an opening through said third insulating layer above said patterned third dielectric layer which allows a subsequent layer to be deposited on said patterned third dielectric layer;
   a fourth semiconductor layer on said patterned third dielectric layer, said third and fourth patterned semiconductor layers and said third patterned dielectric layer forming a third capacitor;
   contact openings provided through said insulating layers, each of which provides access to a respective one of said semiconductor layers and is insulated from the layers of any other semiconductor/dielectric plate; and
   electrical contacts through said contact openings and to said fourth semiconductor layer which provide electrical connections to the semiconductor layers of said first, second and third capacitors.

9. The capacitor structure of claim 8, wherein said third insulated layer is planarized.

10. A method of fabricating a multi-layer integrated circuit capacitor, comprising:
   providing an insulating surface;
   depositing a first semiconductor layer on said insulating surface;
   depositing a first dielectric layer on said first semiconductor layer;
   patterning and etching said first semiconductor and dielectric layers to achieve a desired pattern;
   depositing a first insulating layer on said first dielectric layer;
   patterning and etching said first insulating layer to provide an opening through said first insulating layer above said patterned first dielectric layer which allows a subsequent layer to be deposited on said patterned first dielectric layer;
   depositing a second semiconductor layer on said first dielectric layer;
   depositing a second dielectric layer on said second semiconductor layer;
   patterning and etching said second semiconductor and dielectric layers to achieve a desired pattern, said first and second patterned semiconductor layers and said first patterned dielectric layer forming a first capacitor;

depositing a second insulating layer on said second dielectric layer;

patterning and etching said second insulating layer to provide an opening through said second insulating layer above said patterned second dielectric layer which allows a subsequent layer to be deposited on said patterned second dielectric layer;

depositing, patterning and etching additional semiconductor, dielectric and insulating layers to form additional capacitors;

depositing a topmost insulating layer on said structure;

patterning and etching said topmost insulating layer and said structure to provide contact openings through said insulating layers, each of which provides access to a respective one of said semiconductor layers and is insulated from the layers of any other semiconductor/dielectric plate; and performing a metallization step to provide electrical contacts through said contact openings which provide electrical connections to respective semiconductor layers.

11. The method of claim 10, wherein said semiconductor layers are polysilicon or polycide.

12. The method of claim 10, wherein said dielectric layers are silicon nitride, silicon dioxide, or tantalum oxide.

13. The method of claim 10, wherein each of said semiconductor and dielectric layers is 1000-4000 Å thick.

14. The method of claim 10, wherein said insulating layers are silicon dioxide ($SiO_2$), tetraethyl orthosilicate (TEOS), or plasma-enhanced tetraethyl orthosilicate (PE-TEOS).

15. The method of claim 10, wherein said insulating layers are 1000-4000 Å thick.

* * * * *